(12) United States Patent
Ham

(10) Patent No.: US 9,984,747 B2
(45) Date of Patent: May 29, 2018

(54) VOLTAGE REGULATOR AND RESISTANCE VARIABLE MEMORY APPARATUS HAVING THE SAME

(71) Applicant: SK hynix Inc., Icheon-si, Gyeonggi-do (KR)

(72) Inventor: Hyun Ju Ham, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/484,355

(22) Filed: Apr. 11, 2017

(65) Prior Publication Data

US 2018/0108407 A1 Apr. 19, 2018

(30) Foreign Application Priority Data

Oct. 18, 2016 (KR) .................. 10-2016-0135082

(51) Int. Cl.
*G11C 11/00* (2006.01)
*G11C 13/00* (2006.01)

(52) U.S. Cl.
CPC ........ *G11C 13/0038* (2013.01); *G11C 13/003* (2013.01); *G11C 13/004* (2013.01); *G11C 13/0004* (2013.01); *G11C 13/0069* (2013.01)

(58) Field of Classification Search
CPC ............ G11C 13/0038; G11C 13/0004; G11C 13/003; G11C 13/004; G11C 13/0069
See application file for complete search history.

(56) References Cited

U.S. PATENT DOCUMENTS

| 8,345,466 B2* | 1/2013 | Maejima | G11C 13/0007 365/145 |
|---|---|---|---|
| 2009/0001950 A1* | 1/2009 | Ariki | G05F 1/56 323/273 |
| 2013/0169251 A1* | 7/2013 | Wan | G05F 1/56 323/282 |
| 2014/0049234 A1* | 2/2014 | Park | G05F 1/10 323/265 |
| 2014/0056063 A1* | 2/2014 | Kajigaya | G11C 7/067 365/182 |
| 2015/0061623 A1* | 3/2015 | Lee | G05F 1/575 323/280 |
| 2015/0188421 A1* | 7/2015 | Ko | H02M 3/156 323/282 |
| 2016/0062376 A1* | 3/2016 | Kim | G05F 1/575 323/280 |
| 2016/0079843 A1* | 3/2016 | Yoo | G05F 1/56 323/313 |
| 2016/0379708 A1* | 12/2016 | Katayama | G11C 7/065 365/148 |
| 2017/0206947 A1* | 7/2017 | Affleck | G11C 7/222 |

FOREIGN PATENT DOCUMENTS

KR 1020150116072 A 10/2015
KR 1020160026558 A 3/2016

* cited by examiner

*Primary Examiner* — Toan Le
(74) *Attorney, Agent, or Firm* — William Park & Associates Ltd.

(57) ABSTRACT

A voltage compensation circuit may be provided. The voltage compensation circuit may include a replica circuit block configured to be selected and driven to generate a resistance value for compensating a voltage level.

20 Claims, 8 Drawing Sheets

VOLTAGE REGULATOR AND RESISTANCE VARIABLE MEMORY APPARATUS HAVING THE SAME

CROSS-REFERENCES TO RELATED APPLICATION

The present application claims priority under 35 U.S.C. § 119(a) to Korean application number 10-2016-0135082, filed on Oct. 18, 2016, in the Korean Intellectual Property Office, which is incorporated herein by reference in its entirety.

BACKGROUND

1. Technical Field

Various embodiments may generally relate to a semiconductor integrated apparatus, and more particularly, to a voltage regulator and a resistance variable memory apparatus having the same.

2. Related Art

In general, resistance variable memory apparatuses have attracted attention as next-generation memory apparatuses because of the advantages they provide. The next-generation memory apparatuses allow the following advantages to be merged all together with one apparatus: low-cost, random access, a high-speed operation, low-power consumption, and nonvolatility.

Memory apparatuses are identified as resistance variable memory apparatuses when a data storage material layer is arranged between a pair of electrodes and data is programmed through change in a resistance state of the data storage material layer by an applied current or voltage.

A phase-change random access memory (PRAM) used for the resistance variable memory apparatus may be configured basically of an access element and a data storage material layer configured with a phase-change material. When a preset voltage is applied between a word line and a bit line to write (program) data in the PRAM, a write current may be applied to the data storage material layer and thus, a resistance state of the data storage material layer may be changed.

The resistance variable memory apparatus includes various functional blocks. A constant voltage generation apparatus is used to supply power to the functional blocks. The voltage regulator may have the functionality to convert an external power voltage to a stable power voltage so that a stable power voltage is supplied to the functional blocks, for example, driving circuits.

SUMMARY

In an embodiment of the present disclosure, a voltage regulator may include an output voltage generation unit configured to generate an output voltage by comparing an input voltage and a feedback voltage; and a feedback voltage generation unit configured to generate the feedback voltage by receiving the output voltage and provide the feedback voltage to the output voltage generation unit. The feedback voltage generation unit may include a voltage compensation circuit configured to generate a resistance value for compensating a voltage level which is lowered by an on resistance of an access element group turned on to access a memory cell and an off current flowing in an accessed memory cell; and a feedback circuit configured to provide the feedback voltage detected between the voltage compensation circuit and a voltage ground terminal to the output voltage generation unit.

In an embodiment of the present disclosure, a resistance variable memory apparatus may include a memory cell array including a plurality of memory cells; and a voltage regulator configured to apply a voltage to a memory cell accessed among the plurality of memory cells. The voltage regulator may include an output voltage generation unit configured to generate an output voltage by comparing an input voltage and a feedback voltage; a voltage compensation circuit configured to generate a resistance value for compensating a voltage level which is lowered by an on resistance of an access element group turned on to access the memory cell and an off current flowing in the accessed memory cell; and a feedback circuit configured to provide the feedback voltage detected between the voltage compensation circuit and a voltage ground terminal to the output voltage generation unit.

In an embodiment of the present disclosure, a voltage compensation circuit may include a plurality of replica circuit blocks coupled in parallel and each configured to be selected and driven by trimming signals to generate a resistance value for compensating a voltage level.

DETAILED DESCRIPTION

Various embodiments will be described in with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the description as defined in the appended claims.

The embodiments are described herein with reference to cross-section and/or plan illustrations of idealized embodiments. However, the embodiments should not be construed as limiting the concepts. Although a few embodiments will be illustrated and described, it will be appreciated by those of ordinary skill in the art that changes may be made in these embodiments without departing from the principles and spirit of the disclosure.

Embodiments may provide for a voltage regulator capable of preventing a voltage drop, and may provide for a resistance variable memory apparatus having the same.

According to the embodiments, the voltage regulator may output a voltage amplified by a voltage level dropped due to off currents for an accessed memory cell and memory cells sharing a bit line and a word line with the accessed memory cell and on resistances of switch elements for selecting the accessed memory cell.

Accordingly, an accurate target voltage may be applied to the accessed memory cell and thus the read margin in the read operation may be ensured and the read speed may be improved.

Figure 1:
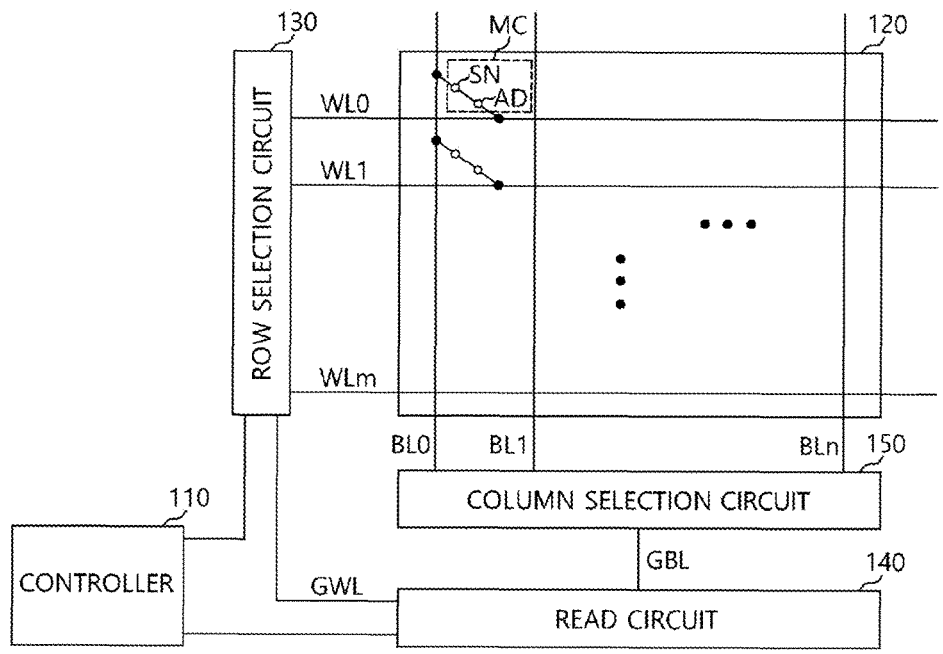
FIG. 1 is a configuration diagram illustrating a resistance variable memory apparatus according to an embodiment of the present disclosure.

FIG. 1 is a diagram illustrating a configuration of a resistance variable memory apparatus according to an embodiment.

Referring to FIG. 1, a resistance variable memory apparatus 10 according to an embodiment may include a controller 110, a memory cell array 120, a row selection circuit 130, a column selection circuit 150, and a read circuit 140.

A controller 110 may control data to be written in the memory cell array 120 in response to a write command input from an external apparatus or a host. The controller 110 may control data to be read from the memory cell array 120 in response to a read command input from the external apparatus or the host.

The memory cell array 120 may be configured to include a plurality of resistance variable memory cells (hereinafter, referred to as memory cells) MC coupled between a plurality of word lines (WLs) WL0 to WLm and a plurality of bit lines (BLs) BL0 to BLn.

The memory cell MC may be, for example, a PRAM cell. In an embodiment, the memory cell MC may include a data storage node SN and an access element AD coupled between a word line WL and a bit line BL.

In an embodiment, the data storage node SN may include a phase-change material. The access element AD may be selected from switching elements such as a diode, a horizontal transistor, a vertical transistor, and an ovonic threshold switching (OTS) element, but the access element is not limited thereto. The access element will be described below with reference to the accompanying drawings.

In an embodiment, the memory cell array 120 may be configured in a cross-point array structure. The cross-point array structure may refer to a structure that a plurality of lower electrodes (bit lines or word lines) and a plurality of upper electrodes (word lines or bit lines) are formed to cross each other and memory cells MC configured of the data storage node SN and the access element AD are electrically coupled to intersections of the lower electrodes and the upper electrodes.

The memory cell MC may be turned on when a level difference between voltages applied to both terminals thereof is larger than a preset level and may be turned off when the level difference is smaller than the preset level.

The row selection circuit 130 may be configured to select a word line WL to be accessed among the plurality of word lines WL0 to WLm based on a row address.

The column selection circuit 150 may be configured to select a bit line BL to be accessed among the plurality of bit lines BL0 to BLn based on a column address.

A memory cell MC to be accessed may be electrically coupled between a word line WL and a bit line BL selected through the row selection circuit 130 and the column selection circuit 150. The read circuit 140 may be coupled to the selected word line WL and the selected bit line BL through a global word line GWL and a global bit line GBL.

The read circuit 140 may be configured to read data from the memory cell array 120 according to control of the controller 110.

In an embodiment, the read circuit 140 may be configured to drop a voltage of the word line WL to a ground voltage VBB level at high speed when the memory cell MC is coupled to the word line WL according to a word line selection signal provided in the read operation and the voltage level of the word line WL starts to drop. The read circuit 140 may be configured to boost up a voltage of the bit line BL to a power voltage VPP level at high speed before the memory cell MC is coupled to the bit line BL according to a bit line selection signal after the voltage of the word line WL is dropped. In an example, the power voltage VPP level may be a pumping voltage level generated through a voltage pumping circuit (not illustrated) and the ground voltage VBB level may be a negative voltage level.

As the voltage level of the word line WL and the voltage level of the bit line BL are controlled to reach target levels at high speed, the time required to turn on the memory cell MC may be shortened. Accordingly, the read operation speed may be improved and the read margin may be sufficiently ensured.

Figure 2:
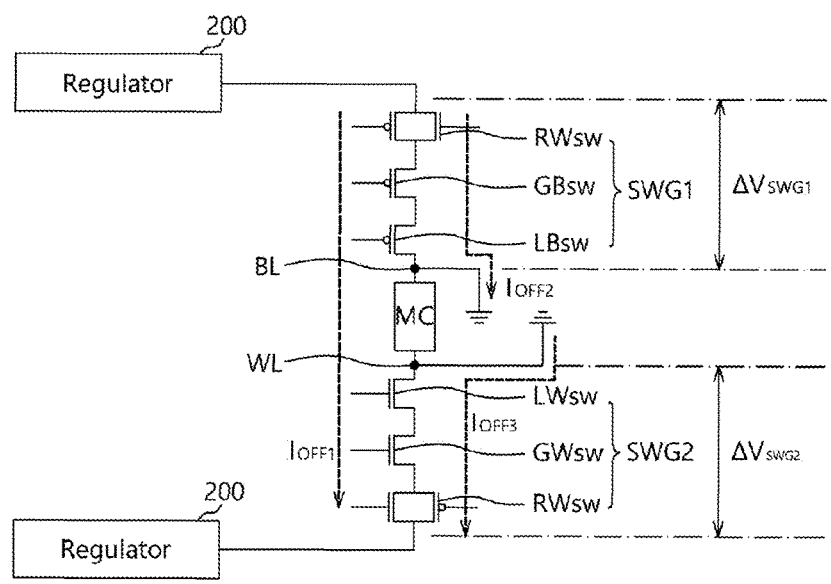
FIG. 2 is a diagram illustrating an example of access elements configured to access the memory cell of FIG. 1 and a voltage regulator configured to apply a voltage to an accessed memory cell according to an embodiment of the present disclosure.

FIG. 2 is a diagram illustrating an example of a configuration of access elements configured to access the memory cell of FIG. 1 and a voltage regulator configured to apply a voltage to an accessed memory cell according to an embodiment. It has been described in FIG. 2 that access elements coupled to the word line WL and access elements coupled to the bit line BL include switching elements comprising transistors, but are not limited thereto.

Referring to FIG. 2, the access elements configured to access the memory cell MC may include a first switch group SWG1 and a second switch group SWG2 which are electrically coupled to the bit line BL and the word line WL electrically coupled to the memory cell MC.

The first switch group SWG1 may include a read and write (read/write) enable switch $RW_{SW}$, a global bit line selection switch $GB_{SW}$, and a local bit line selection switch $LB_{SW}$. The second switch group SWG2 may include a read/write enable switch $RW_{SW}$, a global word line selection switch $GW_{SW}$, and a local word line selection switch $LW_{SW}$. The read/write enable switch $RW_{SW}$ of the first switch group SWG1 and the read/write enable switch $RW_{SW}$ of the second switch group SWG2 may be coupled to voltage regulators 200.

The read/write enable switches $RW_{SW}$ of the first switch group SWG1 and the second switch group SWG2 may select whether to perform a read operation or a write operation on the memory cell MC.

The global bit line selection switch $GB_{SW}$ of the first switch group SWG1 may select one global bit line which is to access a corresponding memory cell MC among global bit lines. The local bit line selection switch $LB_{SW}$ may select one local bit line which is to access the corresponding memory cell MC among a plurality of local bit lines coupled to the selected global bit line.

The global word line selection switch $GW_{SW}$ of the second switch group SWG2 may select one global word line which is to access a corresponding memory cell MC among global word lines. The local word line selection switch $LW_{SW}$ may select one local word line which is to access the corresponding memory cell MC among a plurality of local word lines coupled to the selected global word line.

For example, to perform a read operation or a write operation on the corresponding memory cell MC, all the switches included in the first switch group SWG1 and the second switch group SWG2 may be inevitably turned on to access the corresponding memory cell MC.

When all the switching elements included in the first switch group SWG1 and the second switch group SWG2, for example, the read/write enable switches $RW_{SW}$, the global bit line selection switch $GB_{SW}$, the local bit line selection switch $LB_{SW}$, the global word line selection switch $GW_{SW}$, and the local word line selection switch $LW_{SW}$ are turned on to access the corresponding memory cell MC, an on resistance in each turned-on switch may be generated.

In the memory cell array 120 having the above-described cross-point array structure, when both the first switch group SWG1 and the second switch group SWG2 are turned on to access a memory cell MC and a bit line voltage and a word line voltage are applied to the corresponding memory cell MC, the bit line voltage and the word line voltage applied to the memory cell MC may be applied to memory cells coupled to the same bit line BL and the same word line as the corresponding memory cell MC.

The accessed memory cell MC may refer to a full selected cell and the memory cells coupled to the same bit line BL and the same word line WL as the memory cell MC may refer to half selected cells.

A first off current $I_{OFF1}$ may be generated in the full selected memory cell MC from the bit line BL toward the word line WL. A second off current $I_{OFF2}$ may be generated in the half selected memory cells coupled to the same bit line BL as the corresponding memory cell MC from the bit line BL toward a ground of the word line WL. A third off current $I_{OFF3}$ may be generated in the half selected memory cells coupled to the same word line WL as the corresponding memory cell MC from the ground of the word line WL toward the word line WL.

As an off current $I_{OFF}$, which corresponds to a sum of the first off current $I_{OFF1}$, the second off current $I_{OFF2}$, and the third off current $I_{OFF3}$, and voltage drop $\Delta V_{SWG1}$ and $\Delta V_{SWG2}$, which are caused by the on resistances generated in the switches turned-on to select the accessed memory cell MC, are generated, a target voltage may not be applied to the accessed memory cell MC. When the target voltage is not applied to the accessed memory cell MC, the read margin may be reduced or the read speed may be degraded.

In an embodiment, as a voltage amplified by the dropped voltage level is applied to the accessed memory cell, the target voltage may be applied to the accessed memory cell MC even when the voltage drop or attenuation is caused by the off current $I_{OFF}$ and the on resistances.

Figure 3A:
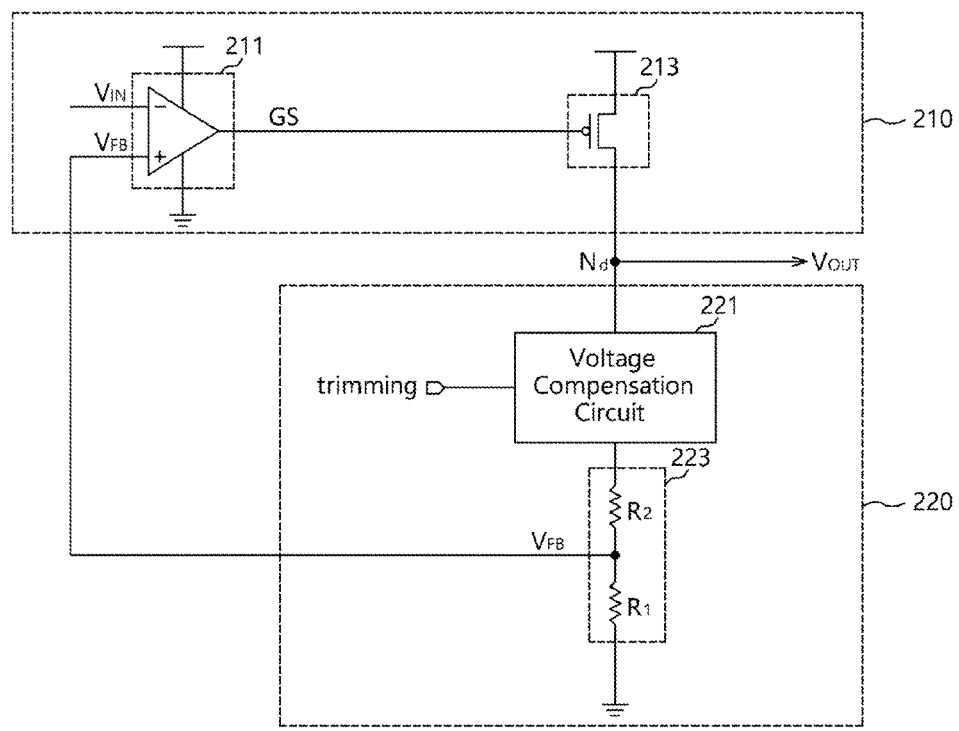
FIGS. 3A and 3B are diagrams illustrating examples of a configuration of the voltage regulator of FIG. 2.
Figure 3B:
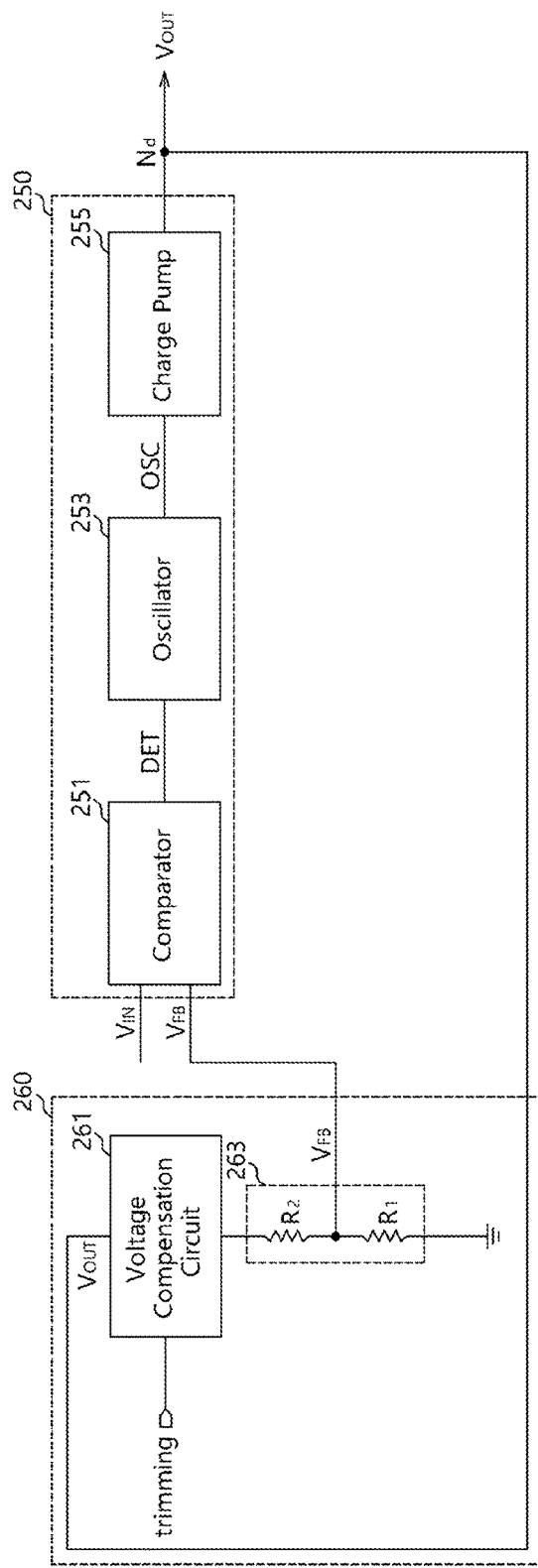

To overcome the voltage drop due to the off current $I_{OFF}$ and the on resistances, voltage regulators including a voltage compensation circuit as illustrated in FIGS. 3A and 3B may be provided in an embodiment. FIG. 3A illustrates an example of a voltage regulator configured to generate a voltage through a down-converting operation according to an embodiment.

Referring to FIG. 3A, a voltage regulator 200A according to an embodiment may include an output voltage generation unit 210 and a feedback voltage generation unit 220.

The output voltage generation unit 210 may generate an output voltage $V_{OUT}$ by receiving an input voltage (or a reference voltage) $V_{IN}$ and a feedback voltage $V_{FB}$. The output voltage generation unit 210 may include an operational amplification circuit 211 and a PMOS transistor 213.

The operational amplification circuit 211 may provide a gate signal GS to the PMOS transistor 213 according to a voltage difference between the input voltage $V_{IN}$ and the feedback voltage $V_{FB}$ fed back from the feedback circuit 223. In an embodiment, the operational amplification circuit 211 may include an operational amplifier having an inverting input terminal which receives the input voltage $V_{IN}$, a non-inverting input terminal which receives the feedback voltage $V_{FB}$, and an output terminal which is coupled to the PMOS transistor 213 to control the gate signal GS. In this example, the operational amplifier may control the input voltage $V_{IN}$ and the feedback voltage $V_{FB}$ to be equalized by providing the gate signal GS having a voltage level corresponding to the voltage difference between the input voltage $V_{IN}$ and the feedback voltage $V_{FB}$.

The PMOS transistor 213 may control a current between a voltage applying terminal and a voltage ground terminal according to the gate signal GS input from the operational amplification circuit 211. In an embodiment, the PMOS transistor 213 may include a source coupled to the voltage applying terminal, a gate coupled to the output terminal of the operational amplification circuit 211, and a drain coupled to the feedback voltage generation unit 220. In this example, the PMOS transistor 213 may control a source-drain current according to the gate signal GS.

The feedback voltage generation unit 220 may generate the feedback voltage $V_{FB}$ by receiving the output voltage $V_{OUT}$ detected from a detection node $N_d$ and provide the feedback voltage $V_{FB}$ to the output voltage generation unit 210.

The feedback voltage generation unit 220 may include a voltage compensation circuit 221 and a feedback circuit 223.

The voltage compensation circuit 221 may be coupled between the detection node $N_d$ and the feedback circuit 223. The voltage compensation circuit 221 may be configured to compensate the voltage drop due to the on resistances generated in the access elements turned on to select the memory cell (see MC of FIG. 2) and the off current flowing in the accessed memory cell MC.

Figure 4A:
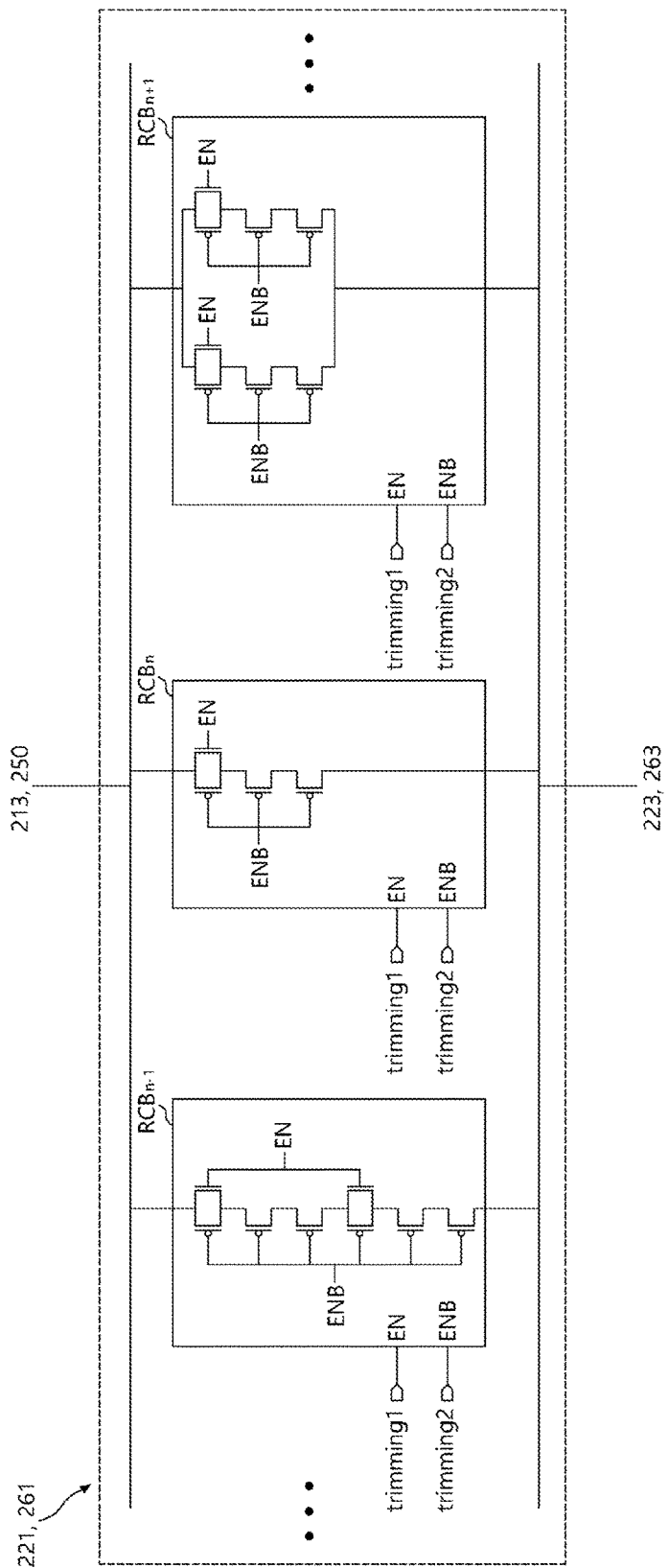
FIGS. 4A and 4B are diagrams illustrating examples of a configuration of a voltage compensation circuit of FIG. 3A.
Figure 4B:
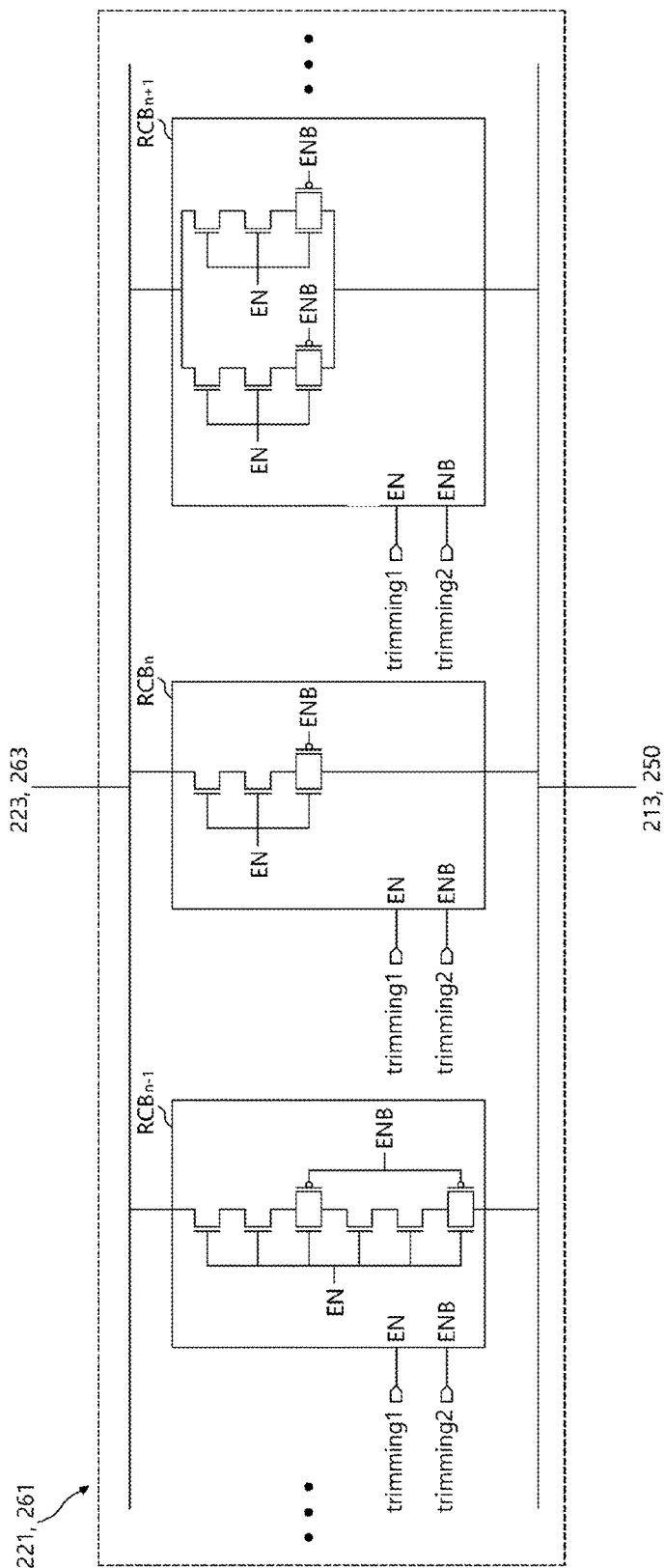

The voltage compensation circuit 221 may include a plurality of replica circuit blocks $RCB_{n-1}$, $RCB_n$, and $RCB_{n+1}$ (hereinafter, collectively referred to as RCB) coupled in parallel as illustrated in FIGS. 4A and 4B. At least one or more replica circuit blocks RCB among the plurality of replica circuit blocks $RCB_{n-1}$, $RCB_n$, and $RCB_{n+1}$ may be selected and driven by trimming signals trimming1 and trimming2. The voltage compensation circuit 221 will be described below with reference to FIGS. 4A and 4B.

The feedback circuit 223 may include a first detection resistor $R_1$ and a second detection resistor $R_2$ coupled between the voltage compensation circuit 221 and the voltage ground terminal. For example, one terminal of the first detection resistor $R_1$ may be coupled to the voltage ground terminal, the other terminal of the first detection resistor $R_1$ may be coupled to one terminal of the second detection resistor $R_2$, and the other terminal of the second detection resistor $R_2$ may be coupled to the voltage compensation circuit 221. The feedback voltage $V_{FB}$ may be output from a connection node between the other terminal of the first detection resistor $R_1$ and the one terminal of the second detection resistor $R_2$ and provided to the operational amplification circuit 211 of the output voltage generation unit 210.

In accordance with an embodiment, the voltage regulator (i.e., 200, 200A, and 200B) may include the voltage compensation circuit 221. For example, a voltage regulator without the voltage compensation circuit 221 may include only the operational amplification circuit 211, the PMOS transistor 213, and the feedback circuit 223. The output voltage $V_{OUT}$ output from the voltage regulator without a voltage compensation circuit may be obtained by the following Equation 1.

$$V_{OUT} = \frac{R_1 + R_2}{R_1} V_{IN} \qquad [\text{Equation 1}]$$

Here, $V_{IN}$ may be the input voltage (or reference voltage), and $R_1$ and $R_2$ may be the first detection resistor and the second detection resistor of the feedback circuit 223.

As described above, the output voltage $V_{OUT}$ may be dropped by the off currents $I_{OFF1}$, $I_{OFF2}$, and $I_{OFF3}$ and the on resistances of the access elements turned on to access a corresponding memory cell MC and the dropped output voltage $V_{OUT}$ may be applied to the accessed memory cell MC. Accordingly, the desired output voltage $V_{OUT}$ may not be applied to the accessed memory cell MC and thus the read margin may be reduced and the read operation speed may be degraded.

According to an embodiment, a voltage regulator may include the voltage compensation circuit 221 in the feedback voltage generation circuit 220 and may output the output voltage $V_{OUT}$ amplified by the voltage level dropped or lowered by the off currents $I_{OFF1}$, $I_{OFF2}$, and $I_{OFF3}$ and the on resistances of the switch groups.

FIG. 3B illustrates an example of a voltage regulator configured to generate a voltage through a pumping operation according to an embodiment.

Referring to FIG. 3B, a voltage regulator 200B according to an embodiment may include an output voltage generation unit 250 and a feedback voltage generation unit 260. Here, the feedback voltage generation unit 260 may substantially have the same configuration as that of the feedback voltage generation unit 210 of FIG. 3A and thus a description thereof will be omitted.

The output voltage generation unit 250 may generate an output voltage $V_{OUT}$ by receiving an input voltage (or reference voltage) $V_{IN}$ and a feedback voltage $V_{FB}$. The output voltage generation unit 250 may include a comparator 251, an oscillator 253, and a charge pump 255.

The comparator 251 may be configured to generate a detection signal DET by comparing the input voltage (or reference voltage) $V_{IN}$ and the feedback voltage $V_{FB}$ fed back from the feedback voltage generation unit 260. The comparator 251 may generate and output the detection signal DET by detecting a voltage level of the feedback voltage $V_{FB}$ using a voltage level of the input voltage $V_{IN}$ using a reference voltage level.

The oscillator 253 may generate and output an oscillation signal OSC oscillated in response to the detection signal DET output from the comparator 251.

The charge pump 255 may generate and output the output voltage $V_{OUT}$ through a pumping operation by receiving the oscillation signal OSC output from the oscillator 253.

The feedback voltage generation unit 260 may generate the feedback voltage $V_{FB}$ by receiving the output voltage $V_{OUT}$ detected from a detection node $N_d$ and provide the feedback voltage $V_{FB}$ to the output voltage generation unit 250.

The feedback voltage generation unit 260 may include a voltage compensation circuit 261 and a feedback circuit 263. The voltage compensation circuit 261 may be coupled between the detection node $N_d$ and the feedback circuit 263. The feedback circuit 263 may include a first detection resistor $R_1$ and a second detection resistor $R_2$ coupled between the voltage compensation circuit 261 and a voltage ground terminal. The feedback voltage $V_{FB}$ may be output from a connection node between the other terminal of the first detection resistor $R_1$ and one terminal of the second detection resistor $R_2$ and provided to the comparator 251 of the output voltage generation unit 250.

FIGS. 4A and 4B are circuit diagrams illustrating examples of a configuration of the voltage compensation circuit of FIG. 3A. It has been illustrated in FIGS. 4A and 4B that the voltage compensation circuit 221 of FIG. 3A is exemplified but the voltage compensation circuit 261 of FIG. 3B may be equally applied. In embodiments, for example, FIGS. 4A and 4B are circuit diagrams illustrating examples of a configuration of the voltage compensation circuit of FIG. 3B.

Referring to FIG. 4A, as described above, the voltage compensation circuit 221 may include a plurality of replica circuit blocks $RCB_{n-1}$, $RCB_n$, and $RCB_{n+1}$. The plurality of replica circuit blocks $RCB_{n-1}$, $RCB_n$, and $RCB_{n+1}$ may be coupled in parallel. Each of the plurality of replica circuit blocks $RCB_{n-1}$, $RCB_n$, and $RCB_{n+1}$ may be configured of combinations of access element groups (for example, a first switch group and a second switch group) configured to access (or select) a memory cell MC.

In an embodiment, the replica circuit blocks RCB may be configured of a combination of the first switch group SWG1 as illustrated in FIG. 4A (see also FIG. 2, SWG1). In this example, the combination of the first switch group SWG1 may include one first switch group SWG1 (i.e., $RCB_n$), at least two first switch groups SWG1 coupled in series (i.e., $RCB_{n-1}$), and at least two first switch groups SWG1 coupled in parallel (i.e., $RCB_{n+1}$). In an embodiment, the replica circuit blocks RCB may be configured of a combination of the second switch group SWG2 as illustrated in FIG. 4B (see also FIG. 2, SWG2). In this example, the combination of the second switch group SWG2 may include one second switch group SWG2 (i.e., $RCB_n$), at least two second switch groups SWG2 coupled in series (i.e., $RCB_{n-1}$), and at least two second switch groups SWG2 coupled in parallel (i.e., $RCB_{n+1}$).

For example, when it is assumed that the access element for accessing the memory cell MC includes one transistor, the voltage compensation circuit 221 may include a replica circuit block RCB including one transistor, a replica circuit block RCB including two transistors coupled in series, a replica circuit block RCB including two transistors coupled in parallel, and the like.

Accordingly, the replica circuit blocks RCB may have differences based on resistance values. If necessary, a portion of the plurality of replica circuit blocks RCB may be activated and the remaining portion of the plurality of replica circuit blocks RCB may be inactivated so that a desired resistance value may be added between the detection mode $N_d$ and the feedback circuit 223 (i.e., 263).

It has been described in FIGS. 4A and 4B for simplification of drawings that only three replica circuit blocks RCB are included, but the number of replica circuit blocks RCB included in the voltage compensation circuit 221 is not limited thereto.

Referring to FIGS. 4A and 4B, the replica circuit blocks $RCB_{n-1}$, $RCB_n$, and $RCB_{n+1}$ may be activated or inactivated through enable signals EN and ENB input through trimming signals.

For example, when the enable signal EN input through a first trimming signal trimming1 is high and the enable signal ENB input through a second trimming signal trimming2 is low, the transistors of the replica circuit blocks $RCB_{n-1}$, $RCB_n$, and $RCB_{n+1}$ may be turned on and the replica circuit blocks $RCB_{n-1}$, $RCB_n$, and $RCB_{n+1}$ may be activated. When the enable signal EN input through the first trimming signal trimming1 is low and the enable signal ENB input through the second trimming signal trimming2 is high, the transistors of the replica circuit blocks $RCB_{n-1}$, $RCB_n$, and $RCB_{n+1}$ may be turned off and the replica circuit blocks $RCB_{n-1}$, $RCB_n$, and $RCB_{n+1}$ may be inactivated.

As described above, the output voltage $V_{OUT}$ output from a voltage regulator having no the voltage compensation circuits 221 or 261 may be represented with Equation 1. The voltage regulator (i.e., 200, 200A, and 200B) in an embodiment including the voltage compensation circuit (i.e., 221 and 261) may output the output voltage $V_{OUT}$ amplified by the voltage level dropped or lowered by the off currents $I_{OFF1}$, $I_{OFF2}$, and $I_{OFF3}$ and the on resistances of the switch groups. Accordingly, the output voltage $V_{OUT}$ output from the voltage regulator (i.e., 200, 200A, and 200B) including the voltage compensation circuit according to an embodiment may be represented with the following Equation 2.

$$V_{OUT} = \frac{V_{IN}}{R_1}\left(R_1 + R_2 + \frac{I_{OFF}}{I_{R1}}R_{SW}\right) \quad [\text{Equation 2}]$$

For example, $I_{OFF}$ may refer to the sum of the off current $I_{OFF1}$ flowing to a memory cell MC through turn-on of access elements, the off currents $I_{OFF2}$ and $I_{OFF3}$ flowing in memory cells coupled to the same bit line and the same word line as the corresponding memory cell MC. $I_{R1}$ may refer to a current flowing to the first detection resistor $R_1$. $R_{SW}$ may refer to on resistances of at least one or more access elements turned on to access the memory cell MC.

$I_{OFF}$ and $I_{R1}$ may be obtained in the design of the resistance variable memory apparatus 10 or may be detected through a test performed after the fabrication of the resistance variable memory apparatus 10 is completed. When "$I_{OFF}/I_{R1}$" in Equation 2 is a constant "a", the "a" value may be obtained in design or may be obtained through a test after fabrication completion. Trimming may be performed to select at least one or more replica circuit blocks RCB among the plurality of replica circuit blocks RCB illustrated in FIGS. 4A and 4B according to the obtained a value. For example, when the a value is 1, the replica circuit block $RCB_n$ among the replica circuit blocks RCB may be selected and activated and the remaining replica circuit blocks RCB may not be selected and may be inactivated. For example, the activated replica circuit block RCB and the inactivated replica circuit block RCB may be changed according to the "a" value.

In an embodiment, the "a" value may be dynamically obtained. For example, change in temperature of the resistance variable memory apparatus 10 may be caused during the operation and change in the voltage drop may be caused according to the temperature change. Accordingly, a dynamic response may be necessary with respect to the voltage drop changed according to the temperature.

In an embodiment, the controller 110 may calculate a corresponding a value based on the temperature of the resistance variable memory apparatus 10 measured through a temperature sensor (not illustrated) provided in the resistance variable memory apparatus 10 and perform trimming to select and activate at least one or more replica circuit blocks RCB according to the calculated a value.

The voltage regulators 200A and 200B according to an embodiment may output the voltage amplified by the voltage drop level caused by the off current $I_{OFF1}$ flowing to the accessed memory cell MC, the off currents $I_{OFF2}$ and $I_{OFF3}$ flowing in the memory cells coupled to the same bit line and the same word line as the corresponding memory cell MC, and the on resistances of switch elements for accessing the corresponding memory cell MC. Even when the voltage drop is caused due to the above-described factors (for example, off current and on resistance), the target voltage may be applied to the accessed memory cell MC. Accordingly, the read operation margin for the corresponding memory cell may be ensured and the read operation speed may be improved.

FIGS. 5 to 9 are configuration diagrams illustrating examples of an electronic apparatus according to various embodiments of the present disclosure.

Figure 5:
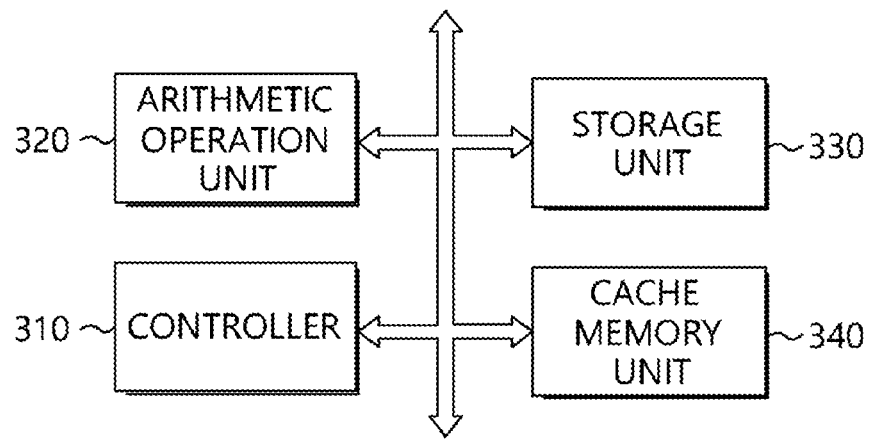
FIGS. 5 to 9 are configuration diagrams illustrating electronic apparatuses according to embodiments of the present disclosure.

FIG. 5 is a configuration diagram illustrating an example of a processor as an electronic apparatus according to an embodiment of the present disclosure.

Referring to FIG. 5, a processor 30 may include a controller 310, an arithmetic operation unit 320, a storage unit 330, and a cache memory unit 340.

The controller 310 may control an overall operation of the processor 30 such as operations of decoding a command, performing input, output, or processing on data, and the like by receiving a signal such as the command or the data from an external apparatus.

The arithmetic operation unit 320 may perform several arithmetic operations according to a decoding result of the command in the controller 310. The arithmetic operation unit 320 may include at least one arithmetic and logic unit (ALU), but this is not limited thereto.

The storage unit 330 may serve as a register, and may be configured to store data in the processor 30. The storage unit 330 may include a data register, an address register, a floating-point register, and other various registers. The storage unit 330 may store addresses in which data operated in the arithmetic operation unit 320, data according to an operation result, and data to be processed in the arithmetic operation unit 320 are stored.

The storage unit 330 may be configured of a resistance variable memory apparatus and may include the voltage regulator having the voltage compensation circuit as illustrated in FIGS. 4A and 4B. Accordingly, a read margin in a read operation may be ensured and read speed may be improved.

The cache memory unit 340 may serve as a temporary storage space.

The processor 30 illustrated in FIG. 5 may be a central processing unit (CPU) of an electronic apparatus, a graphic processing unit (GPU), a digital signal processor (DSP), an application processor (AP), and the like.

Figure 6:
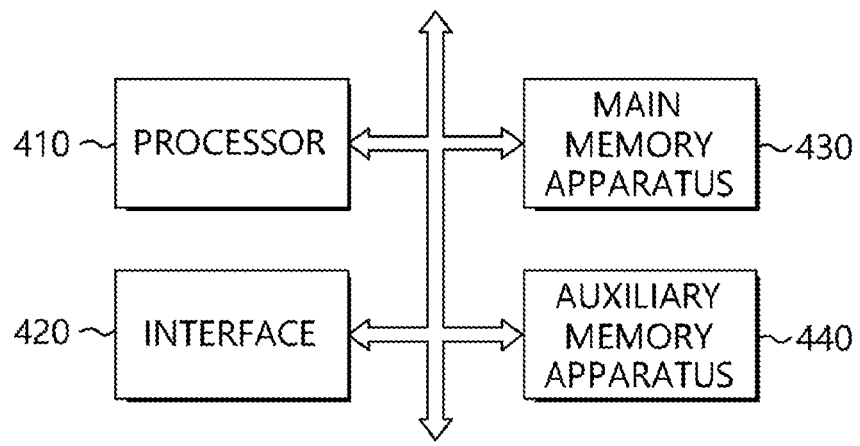
Figure 7:
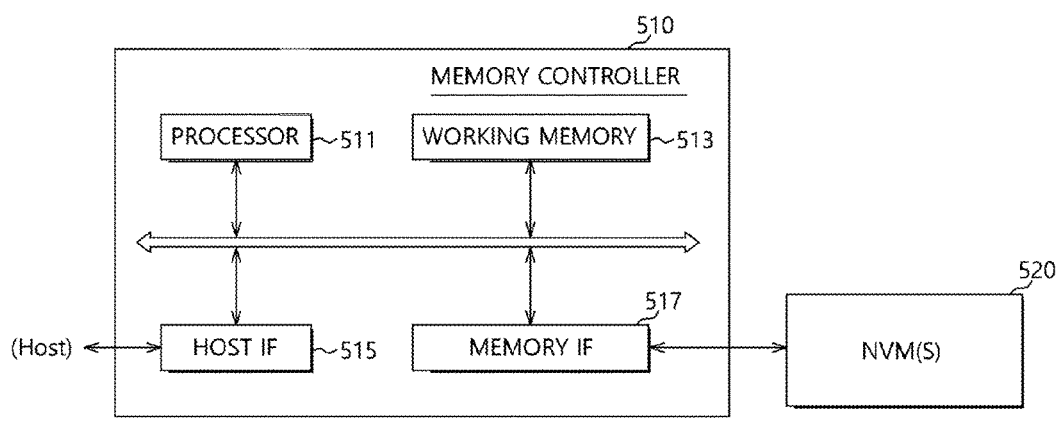

FIGS. 6 and 7 are configuration diagrams illustrating other examples of a data processing system as an electronic apparatus according to various embodiments of the present disclosure.

A data processing system 40 illustrated in FIG. 6 may include a processor 410, an interface 420, a main memory apparatus 430, and an auxiliary memory apparatus 440.

The data processing system 40 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV).

In an embodiment, the data processing system 40 may be a data storage apparatus. The data processing system 40 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card.

The processor 410 may control data exchange between the main memory apparatus 430 and an external apparatus through the interface 420, and the processor 410 may control an overall operation such as decoding of commands input from the external apparatus through the interface 420 and an operation, comparison, and the like of data stored in the system.

The interface 420 may provide an environment that a command and data are exchangeable between the external apparatus and the data processing system 40. The interface 420 may be a man-machine interface apparatus which includes an input apparatus (for example, a keyboard, a keypad, a mouse, a voice recognition apparatus, and the like) and an output apparatus (for example, a display, a speaker, and the like) or a card interface apparatus or a disc interface apparatus (for example, Integrated Drive Electronics (IDE), Small Computer System Interface (SCSI), Serial Advanced Technology Attachment (SATA), External SATA (eSATA), Personal Computer Memory Card International Association (PCMCIA), and the like) according to an application environment of the data processing system 40.

The main memory apparatus 430 may store an application, a control signal, data, and the like required for an operation of the data processing system 40, and may serve as a storage space which may transfer and execute program or data from the auxiliary storage apparatus 440. The main memory apparatus 430 may be implemented using a nonvolatile memory apparatus.

The auxiliary memory apparatus 440 may be a space for storage of a program code, data, and the like, and may be a high-capacity memory apparatus. For example, the auxiliary memory apparatus 440 may be implemented using a nonvolatile memory apparatus.

The main memory apparatus 430 and the auxiliary memory apparatus 440 may be configured of a resistance variable memory apparatus and may include the voltage regulator having the voltage compensation circuit as illustrated in FIGS. 4A and 4B. Accordingly, a read margin in a read operation may be ensured and read speed may be improved.

A data processing system 50 illustrated in FIG. 7 may include a memory controller 510 and a nonvolatile memory apparatus 520 (NVM(S)).

The memory controller 510 may be configured to access the nonvolatile memory apparatus 520 in response to a request from a host. The memory controller 510 may include a processor 511, a working memory 513, a host interface 515, and a memory interface (IF) 517.

The process 511 may be configured to control an overall operation of the memory controller 510. The working memory 513 may store an application, data, a control signal, and the like required for the operation of the memory controller 510.

The host interface 515 may perform protocol conversion for exchange of data and a control signal between the host and the memory controller 510, and the memory interface 517 may perform protocol conversion for exchange of data and a control signal between the memory controller 510 and the nonvolatile memory apparatus 520.

In an embodiment, the nonvolatile memory apparatus 520 and/or the working memory 513 may be configured of a resistance variable memory apparatus and may include the voltage regulator having the voltage compensation circuit as illustrated in FIGS. 4A and 4B. Accordingly, a read margin in a read operation may be ensured and read speed may be improved.

The data processing system 50 illustrated in FIG. 7 may be used as a disc apparatus or internal/external memory cards of a portable electronic apparatus. The data processing system 50 may be used as an image processor and other application chipsets FIGS. 8 and 9 are configuration diagrams illustrating other examples of an electronic apparatus according to various embodiments of the present disclosure.

Figure 8:
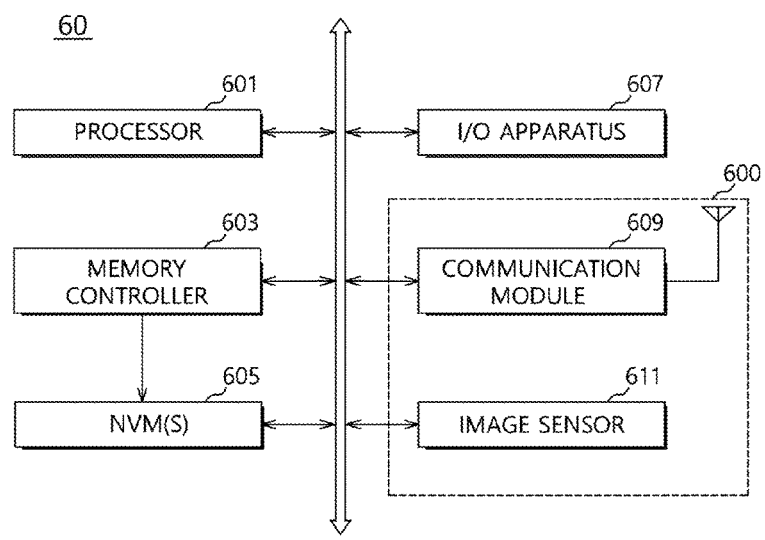
Figure 9:
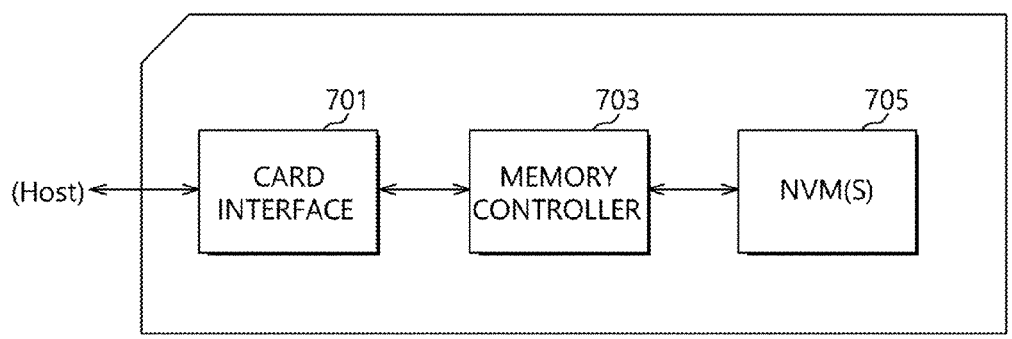

An electronic apparatus 60 illustrated in FIG. 8 may include a processor 601, a memory controller 603, a nonvolatile memory apparatus 605, an input/output (I/O) apparatus 607, and a function module 600.

The memory controller 603 may control a data processing operation, for example, a write operation, a read operation, and the like of the nonvolatile memory apparatus 605 according to control of the processor 601.

Data programmed in the nonvolatile memory apparatus 605 may be output through the I/O apparatus 607 according to control of the processor 601 and the memory controller 603. For example, the I/O apparatus 607 may include a display apparatus, a speaker apparatus, and the like.

In an embodiment, the nonvolatile memory apparatus 605 may be configured of a resistance variable memory apparatus and may include the voltage regulator having the voltage compensation circuit as illustrated in FIGS. 4A and 4B. Accordingly, a read margin in a read operation may be ensured and read speed may be improved.

The I/O apparatus 607 may also include an input apparatus, and the I/O apparatus 607 may input a control signal for controlling an operation of the processor 601 or data to be processed in the processor 601 through the input apparatus.

In an embodiment, the memory controller 603 may be implemented with a portion of the processor 601 or a separate chipset from the processor 601.

The function module 600 may be a module which may perform a function selected according to an application example of the electronic apparatus 60 illustrated in FIG. 8, and a communication module 609 and an image sensor 611 as an example of the function module 600 are illustrated in FIG. 8.

The communication module 609 may provide a communication environment that the electronic apparatus 60 is coupled to a wired or wireless communication network to exchange data and a control signal.

The image sensor 611 may convert an optical image to digital image signals and transfer the digital image signals to the processor 601 and the memory controller 603.

When the function module 600 includes the communication module 609, the electronic apparatus 60 of FIG. 8 may be a portable communication apparatus such as a wireless communication terminal. When the function module 600 may include the image sensor 611, the electronic apparatus 60 may be a digital camera, a digital camcorder, or an electronic apparatus (for example, a personal computer (PC), a laptop computer, a mobile communication terminal, and the like) to which any one of the digital camera and the digital camcorder is attached.

The electronic apparatus 60 may also include both the communication module 609 and the image sensor 611.

An electronic apparatus 70 illustrated in FIG. 9 may include a card interface 701, a memory controller 703, and a nonvolatile memory apparatus 705.

FIG. 9 is an illustrative diagram illustrating the electronic apparatus 70 used as a memory card or a smart card, and the electronic apparatus 70 illustrated in FIG. 9 may be any one among a PC card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may refer to hardware which may support a protocol used in the host, software installed in the hardware which may support the protocol used in the host, or a signal transmission method.

The memory controller 703 may control data exchange between the nonvolatile memory apparatus 705 and the card interface 701.

The nonvolatile memory apparatus 705 may be configured of a resistance variable memory apparatus and may include the voltage regulator having the voltage compensation circuit as illustrated in FIGS. 4A and 4B. Accordingly, a read margin in a read operation may be ensured and read speed may be improved.

The above described embodiments are intended to illustrate and not to limit the present description. Various alternatives and equivalents are possible. The description is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A voltage regulator comprising:
 an output voltage generation unit configured to generate an output voltage by comparing an input voltage and a feedback voltage; and
 a feedback voltage generation unit configured to generate the feedback voltage by receiving the output voltage and provide the feedback voltage to the output voltage generation unit,
 wherein the feedback voltage generation unit includes:
 a voltage compensation circuit configured to generate a resistance value for compensating a voltage level which is lowered by an on resistance of an access element group turned on to access a memory cell and an off current flowing in an accessed memory cell, and include at least one or more access element groups; and
 a feedback circuit configured to provide the feedback voltage detected between the voltage compensation circuit and a voltage ground terminal to the output voltage generation unit.

2. The voltage regulator of claim 1, wherein the voltage compensation circuit includes a plurality of replica circuit blocks coupled in parallel and including different combinations of the access element groups.

3. The voltage regulator of claim 2, wherein the plurality of replica circuit blocks include:
 a first replica circuit block configured of one access element group;
 at least one or more second replica circuit blocks configured of at least two or more access element groups coupled in series; and
 at least one or more third replica circuit blocks configured of at least two or more access element groups coupled in parallel.

4. The voltage regulator of claim 2, wherein the feedback circuit includes a first detection resistor and a second detection resistor coupled in series between the voltage compensation circuit and the voltage ground terminal.

5. The voltage regulator of claim 4, wherein one terminal and the other terminal of the first detection resistor are coupled to the voltage ground terminal and one terminal of the second detection resistor and the other terminal of the second detection resistor is coupled to the voltage compensation circuit, and the feedback voltage is output from a connection node of the other terminal of the first detection resistor and the one terminal of the second detection resistor and provided to the output voltage generation unit.

6. The voltage regulator of claim 5, wherein the resistance value is generated by activating at least one or more replica circuit blocks among the plurality of replica circuit blocks based on the off current and a current flowing to the first detection resistor.

7. The voltage regulator of claim 6, wherein the off current includes:
 a first off current generated before the access memory cell is turned on;
 a second off current generated in memory cells coupled to the same bit line as the accessed memory cell; and
 a third off current generated in memory cells coupled to the same word line as the accessed memory cell.

8. The voltage regulator of claim 1, wherein the output voltage generation unit includes:
 an operational amplification circuit configured to output a gate signal according to a voltage difference between the input voltage and the feedback voltage; and
 a PMOS transistor configured to control a current between a voltage applying terminal and the voltage ground terminal by receiving the gate signal.

9. The voltage regulator of claim 8, wherein the operational amplification circuit includes an operational amplifier having an inverting input terminal configured to receive the input voltage, a non-inverting input terminal configured to receive the feedback voltage, and an output terminal which is coupled to the PMOS transistor to control the gate signal.

10. The voltage regulator of claim 1, wherein the output voltage generation unit includes:
 a comparator configured to generate and output a detection signal by comparing the input voltage and the feedback voltage;
 an oscillator configured to generate and output an oscillation signal oscillated in response to the detection signal output from the comparison circuit; and
 a charge pump configured to generate and output the output voltage through a pumping operation by receiving the oscillation signal output from the oscillator.

11. A resistance variable memory apparatus comprising:
 a memory cell array including a plurality of memory cells; and
 a voltage regulator configured to apply a voltage to a memory cell accessed among the plurality of memory cells,
 wherein the voltage regulator includes:
 an output voltage generation unit configured to generate an output voltage by comparing an input voltage and a feedback voltage;
 a voltage compensation circuit configured to generate a resistance value for compensating a voltage level which is lowered by an on resistance of an access element group turned on to access the memory cell and an off current flowing in the accessed memory cell, and include at least one or more access element groups; and a feedback circuit configured to provide the feedback voltage detected between the voltage compensation circuit and a voltage ground terminal to the output voltage generation unit.

12. The resistance variable memory apparatus of claim 11, wherein the voltage compensation circuit includes a plurality of replica circuit blocks coupled in parallel and including different combinations of the access element groups.

13. The resistance variable memory apparatus of claim 12, wherein the plurality of replica circuit blocks includes:
- a first replica circuit block configured of one access element group;
- at least one or more second replica circuit blocks configured of at least two or more access element groups coupled in series; and
- at least one or more third replica circuit blocks configured of at least two or more access element groups coupled in parallel.

14. The resistance variable memory apparatus of claim 12, wherein the feedback circuit includes a first detection resistor and a second detection resistor coupled in series between the voltage compensation circuit and the voltage ground terminal.

15. The resistance variable memory apparatus of claim 14, wherein one terminal and the other terminal of the first detection resistor are coupled to the voltage ground terminal and one terminal of the second detection resistor and the other terminal of the second detection resistor is coupled to the voltage compensation circuit, and the feedback voltage is output from a connection node of the other terminal of the first detection resistor and the one terminal of the second detection resistor and provided to the output voltage generation unit.

16. The resistance variable memory apparatus of claim 15, wherein the resistance value is generated by activating at least one or more replica circuit blocks among the plurality of replica circuit blocks based on the off current and a current flowing to the first detection resistor.

17. A voltage compensation circuit comprising:
- a plurality of replica circuit blocks coupled in parallel and each configured to be selected and driven by trimming signals to generate a resistance value for compensating a voltage level.

18. The voltage compensation circuit of claim 17, wherein each of the plurality of replica circuit blocks includes at least one access element group configured to access a memory cell.

19. The voltage compensation circuit of claim 18, wherein the plurality of replica circuit blocks include a first replica circuit block configured of one access element group, at least one or more second replica circuit blocks configured of at least two or more access element groups coupled in series; and at least one or more third replica circuit blocks configured of at least two or more access element groups coupled in parallel.

20. The voltage compensation circuit of claim 18,
wherein the voltage level is decreased by an on resistance of the access element group turned on to access the memory cell and an off current flowing in an accessed memory cell, and
wherein the decreased voltage level is increased by t.

* * * * *